United States Patent
Savanth et al.

(10) Patent No.: US 11,024,624 B2
(45) Date of Patent: Jun. 1, 2021

(54) DEVICES AND METHODS TO CONTROL CLAMPING DEVICES

(71) Applicants: Arm Limited, Cambridge (GB); The Regents of the University of Michigan, Ann Arbor, MI (US)

(72) Inventors: Parameshwarappa Anand Kumar Savanth, Cambridge (GB); Fabrice Blanc, Vinay (FR); David Theodore Blaauw, Ann Arbor, MI (US); Sechang Oh, Ann Arbor, MI (US); In Hee Lee, Ann Arbor, MI (US)

(73) Assignees: Arm Limited, Cambridge (GB); The Regents of the University of Michigan, Ann Arbor, MI (US)

( * ) Notice: Subject to any disclaimer, the term of this patent is extended or adjusted under 35 U.S.C. 154(b) by 282 days.

(21) Appl. No.: 16/044,231

(22) Filed: Jul. 24, 2018

(65) Prior Publication Data

US 2020/0035668 A1 Jan. 30, 2020

(51) Int. Cl.
*H01L 27/02* (2006.01)
*H02H 1/00* (2006.01)
*H02H 9/04* (2006.01)

(52) U.S. Cl.
CPC ....... *H01L 27/0277* (2013.01); *H02H 1/0007* (2013.01); *H02H 9/046* (2013.01)

(58) Field of Classification Search
CPC ............... H01L 27/027; H01L 27/0277; H01L 27/0285; H02H 1/0007; H02H 9/046

USPC .......................................................... 361/56
See application file for complete search history.

(56) References Cited

U.S. PATENT DOCUMENTS

| | | | | |
|---|---|---|---|---|
| 2007/0058306 | A1* | 3/2007 | Poulton | H01L 27/0285 361/56 |
| 2007/0091530 | A1* | 4/2007 | Chen | H02H 9/046 361/111 |
| 2008/0007882 | A1* | 1/2008 | Bernard | H02H 9/046 361/56 |
| 2013/0057993 | A1* | 3/2013 | Fukasaku | H01L 27/0274 361/56 |
| 2015/0270258 | A1* | 9/2015 | Dabral | H02H 3/20 361/56 |
| 2019/0319453 | A1* | 10/2019 | Sithanandam | H01L 27/0285 |

OTHER PUBLICATIONS

Chen, et al.; 45pW ESD Clamp Circuit for Ultra-Low Power Applications; Proceedings of the IEEE 2013 CICC; IEEE; 2013. DOI: 10.1109/CICC.2013.6658522.

(Continued)

*Primary Examiner* — Kevin J Comber
(74) *Attorney, Agent, or Firm* — Pramudji Law Group PLLC; Ari Pramudji

(57) ABSTRACT

In a particular implementation, an apparatus to control clamping devices includes a first control circuit and a second control circuit. The first control circuit is responsive to a detection signal and generates a first drive signal to control a body diode of a clamping device. The second control circuit is responsive to the detection signal and generates a second drive signal to control the gate terminal of the clamping device.

17 Claims, 8 Drawing Sheets

(56) References Cited

OTHER PUBLICATIONS

Ker, et al; New Design of Transient-Noise Detection Circuit with SCR Device for System-Level ESD Protection; 10th IEEE International NEWCAS Conference; IEEE; 2012. DOI: 10.1109/NEWCAS.2012.6328961.

Chun, Jung-Hoon; ESD Protection Circuits for Advanced CMOS Technologies; Stanford Dissertation; Jun. 2006.

Duvvury, et al.; Substrate Pump NMOS for ESD Protection Applications; EOS/ESD Symposium; 2000. DOI: 10.1109/EOSESD.2000.890022.

\* cited by examiner

DEVICES AND METHODS TO CONTROL CLAMPING DEVICES

STATEMENT AS TO FEDERALLY-SPONSORED RESEARCH

The U.S. Government has certain rights in this invention pursuant to Grant No. HR0011-17-9-0025 awarded by DARPA.

FIELD

The present disclosure is generally related to devices and methods to control clamping devices.

DESCRIPTION OF RELATED ART

Robustness against electrostatic discharge (ESD) is a critical reliability issue in advanced complementary metal-oxide-semiconductor (CMOS) technologies. In CMOS integrated circuits (ICs), on-chip ESD protection circuits may be used to protect core circuitry from damaging high voltages (such as kV range voltages) caused by ESD events. To prevent circuit damage, ESD clamp circuits are typically incorporated in supply pad library cells and/or input/output (IO) rings (i.e., IO circuits) along the periphery of a semiconductor memory chip.

Conventional ESD clamp protection schemes may utilize a resistor-capacitor (RC) circuit arrangement that may delay the "turn-off" of a clamping device (e.g., a large N-channel field effect transistor (FET) (referred to as a "bigFET"). The RC circuit arrangement may be configured to sensitize the clamping device to fast ESD voltage transient signals; by turning the clamping device "on", the clamping device may "short" the ESD transient voltage across supply rails (e.g., $V_{DD}$ and $V_{SS}$), and, therefore, quench the ESD transient event. Hence, the clamping device may shunt an ESD current between the two rails and clamp the voltage across the rails to a voltage that is safe for the functional circuitry. The absence of this type of scheme can expose internal core devices in the chip to transient voltage, thus causing catastrophic damage.

Nevertheless, as a design constraint, the conventional ESD clamping device should be large enough to carry up to 6 amps (A) of transient current, but also "turn-on" quickly to prevent core devices from transient ESD event exposure. However, during normal operation when there is no transient voltage on a supply rail, conventional ESD clamping devices may exhibit unacceptable current leakage due to a larger clamp size as well as inverter current leakage due to rapid response of the ESD clamping device itself.

In current and future subthreshold systems, especially in the context of internet-of-things (IOT) devices (that may require aggressive scaling of power to the device to rely on energy harvesting or to use a single battery for several years), the core sleep power is expected to be less than 10 nW. Nevertheless, any power benefits are negated by intolerable IO leakage partly as a result of the above-described design constraint. The problem may be exacerbated by the higher IO voltage as compared to core voltage. Hence, there is a need in the art for ESD circuits that satisfy low current leakage requirements, yet still provide ESD protection.

DETAILED DESCRIPTION

According to one implementation of the present disclosure, an apparatus to reduce current leakage includes a first control circuit and a second control circuit. The first control circuit is responsive to a detection signal and generates a first drive signal to control a body diode of a clamping device. The second control circuit is responsive to the detection signal and generates a second drive signal to control the gate terminal of the clamping device.

According to another implementation of the present disclosure, a method includes receiving a detection signal at first and second control circuits. The detection signal indicates a presence of a transient voltage signal. The method also includes enabling the first control circuit that is responsive to the detection signal to control a body diode of a clamping device. The method further includes enabling the second control circuit that is responsive to the detection signal to control the gate terminal of the clamping device.

According to another implementation of the present disclosure, another method includes receiving first and second detection signals at a control circuit. The first and second detection signals indicate a presence of a transient voltage signal. The method also includes enabling the control circuit that is responsive to the first detection signal to control a body diode of a clamping device. The method further includes enabling the control circuit that is responsive to the second detection signal to at least partially quench the transient voltage signal. The second detection signal is configured to control a gate terminal of the clamping device.

Particular implementations of the present disclosure are described below with reference to the drawings. In the description, common features are designated by common reference numbers throughout the drawings.

Figure 1:
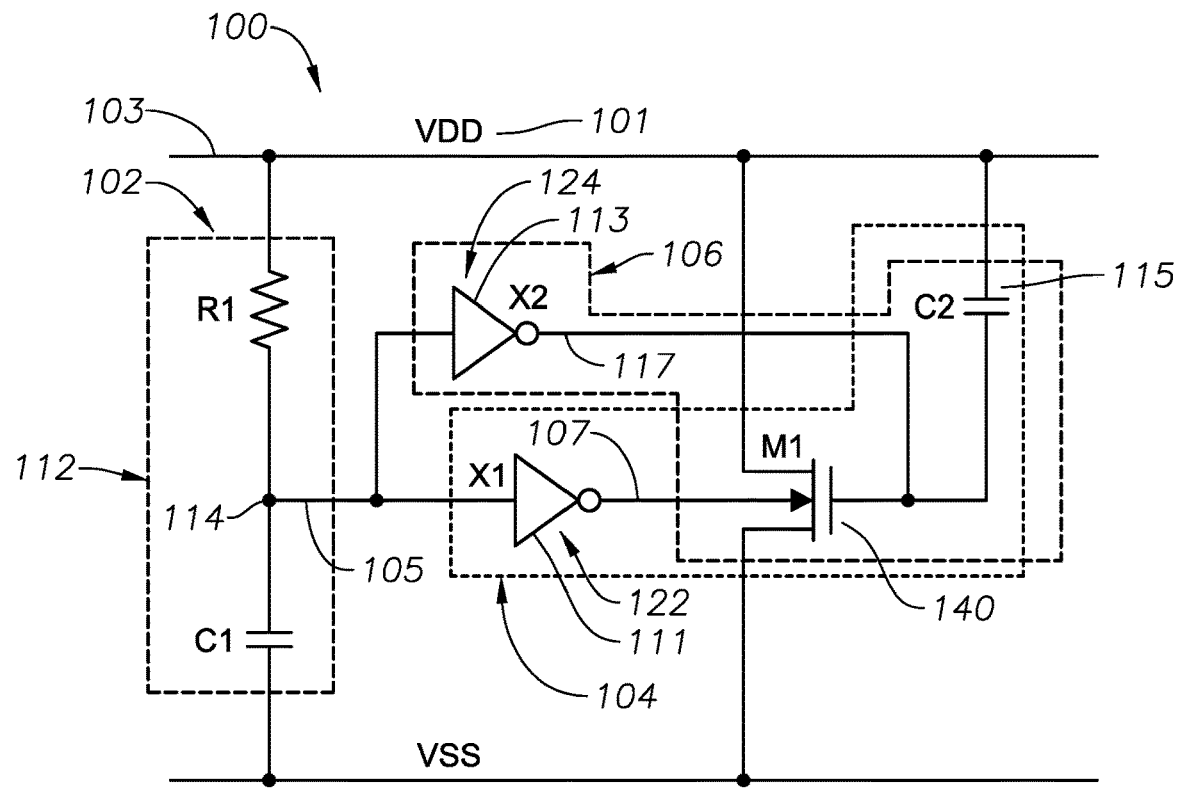
FIG. 1 is a circuit diagram of a system that is operable to control an example clamping device.

Referring to FIG. 1, a system 100 (i.e., an integrated circuit) to control a clamping device is shown. The system 100 includes a detection stage 102 (i.e., a detection circuit), a first control circuit 104, and a second control circuit 106. The detection stage 102 may be configured to quickly detect a destructive transient voltage signal 101 (e.g., a "noise" signal, a voltage transient, an external undesired electrical event) on a power supply rail 103 (i.e., power rail, supply rail, voltage source) (e.g., VDD) and transmit a detection signal 105 (i.e., a transient-triggered detection signal, a delayed version of the transient voltage signal 101) to both the first control circuit 104 and the second control circuit 106. Enabled by the detection signal 105, the first control circuit 104 may be configured to control a body diode of a clamping device 140, while the second control circuit 106 may be configured to control a gate terminal of the clamping device 140.

The detection stage 102 may include a detection portion 112 having a resistor and a capacitor (i.e., an R-C structure) that is coupled to a reference node 114, and that is responsive to the transient voltage signal 101 from the power supply rail 103. In alternative implementations, the detection portion 112 may include other circuit elements and/or circuit devices that are configured to generate the detection signal 105.

Responsive to the detection signal 105, the first control circuit 104 and the second control circuit 106 are configured to enable (e.g., activate) the clamping device 140 to at least partially quench transient power rail voltage. The first control circuit 104 may include an amplification portion 122 (i.e., amplification stages), the clamping device 140, and a supporting capacitor 115. In example implementations, the amplification portion 122 may include a first inverter 111 that is configured to generate a first drive signal 107 at the output of an amplification portion 122. The first drive signal 107 is configured to control (i.e., to bias) the body diode of the clamping device 140. The second control circuit 106 may include a second amplification portion 124, the clamping device 140, and the supporting capacitor 115. Also, the second amplification portion 124 may include a second inverter 113 that is configured to generate a second drive signal 117 at the output of the second amplification portion 124. The second drive signal 117 is configured to control (i.e., to bias) the gate terminal of the clamping device 140. In alternative implementations, each of the first and second control circuits 104, 106 may include two or more amplification portions 124.

The clamping device 140 may include any circuit device having at least two terminals. In some implementations, the clamping device 140 may be one or more field-effect transistors (FET). For example, the clamping device 140 may be a n-channel FET or a big-FET. In example embodiments, the clamping device 140 may be configured to shunt ESD current between supply rails, VDD and VSS, and to at least partially quench transient voltage (i.e., remove electrostatic charge) in the system 100.

The supporting capacitor 115 may be configured to further reduce leakage in the control circuit 106. The supporting capacitor 115 may be coupled between the power rail 103 and a node 116 coupling the gate terminal of the clamping 140. Advantageously, the supporting capacitor 115 may also allow for improved ESD detection and clamp activation response time.

Advantageously, for the duration of an ESD event, the system 100 of FIG. 1 may thus utilize concurrent active biasing of both the body diode and the gate terminal of the clamping device 140 via separate first and second drive signals 107, 117 in response to the transient-triggered detection signal 105. Near-simultaneous active biasing of the body diode and the gate terminal of the clamping device allows for lower "on-resistance" and "on-time". Further, the improved on-resistance allows for a smaller clamping device 140 design to be implemented, thus saving leakage current under normal operation (i.e., steady state operation). Also, the second inverter may also have a smaller design, thus further reducing leakage. Accordingly, the first and second inverters 111, 113 may be sized to optimally drive both the body diode (to compensate high drive strength) and the gate terminal (to compensate high voltage). In doing so, the clamping device 140 may "boost" operation to more efficiently quench the transient voltage that appears on the power rail 103. Hence, with more efficient operation, the size of the clamping device 140 may be optimized down such that a smaller clamping device size may be used to mitigate an equivalent amount of transient voltage. Further, by utilizing a smaller area clamping device 140, less overall current leakage can be realized. Accordingly, the system 100 (as systems 400, 500, and 600 as described in below paragraphs) may be implemented for the protection and mitigation of undesired electrical events (such as ESD events).

Figure 2:
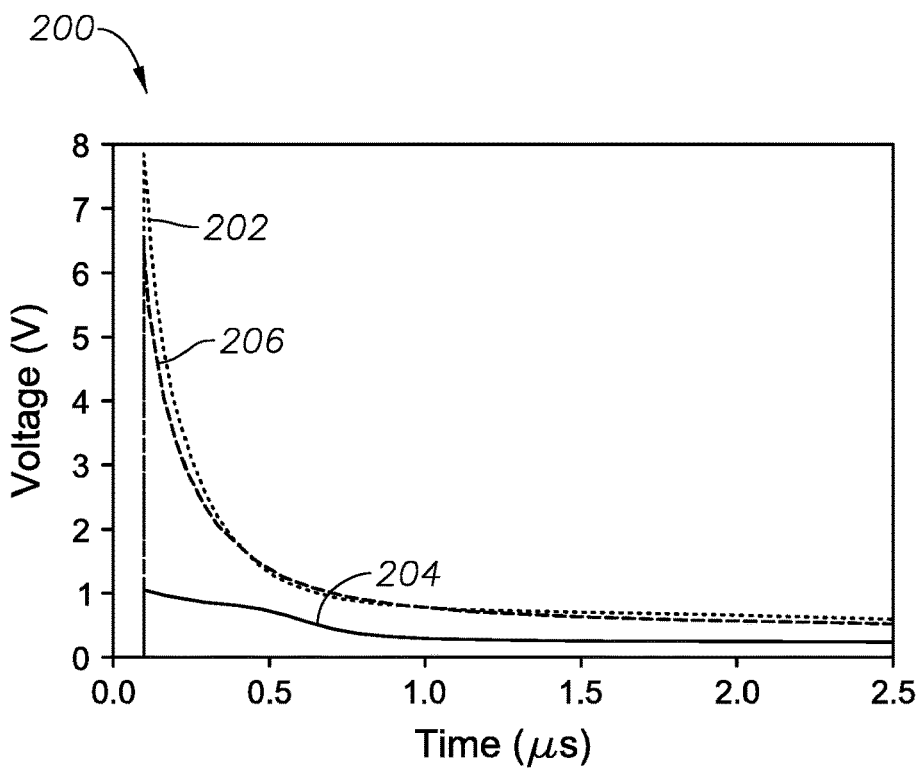
FIG. 2 is a graph illustrating a voltage waveform simulation of the system of FIG. 1.

Referring to FIG. 2, a graph 200 illustrating an example voltage waveform simulation of FIG. 1. As an example, the graph 200 illustrates voltage (V) on the y-axis as a function of time (μs) on the x-axis. As an example, when a noise signal 202 appears on a power rail, the voltage may go up to 6-8V (event though the noise signal itself may go up to a few thousand volts), as the clamping device 140 "turns on" concurrently. In operation, a body voltage 204 of the clamping device 140 may go up to 1V and decay, while a gate voltage 206 of the clamping device may go up significantly higher to the 6-7V range. This occurrence is significant in that it demonstrates different voltages for the body and the gate of the clamping device 140. In contrast, known ESD protection techniques that include a signal to control both the body diode and gate terminals of a conventional clamping device would result in approximately similar voltages for both its body and gate terminals. For example, a body diode would limit a gate such that their respective voltage signals would overlap, and thus, the gate would not reach the 6-7V range. Hence, as compared to the exemplary circuit devices (as described herein) that include separate drive signals (or a drive signal and separate detection trigger signal with regard to the system 400) for both the body diode and the gate terminals, the conventional ESD protection devices are limited in device performance. As an example, the graph 200 is described with reference to the system 100, but similar simulations may be conducted with regard to other example embodiments as described with reference to the systems 400, 500, and 600 in below paragraphs.

Referring to FIG. 3, a diagram 300 illustrating the differences between a conventional clamping device and the example clamping device 140 is shown. As an example, the diagram illustrates the conventional clamping device and the clamping device 140 under normal operation as well as under ESD stress due to a transient voltage. In FIG. 3A, the conventional clamping device is shown as "turned-off" (i.e., under no ESD stress). To alleviate excess voltage, the conventional case may use a parasitic diode 302 to offer reverse-current protection. However, as shown, the parasitic diode 302 may leak current between the p-substrate (p-sub) and the n-type dopants (N+) between VDD to VSS. In FIG. 3B, under ESD stress, in the conventional scheme, an avalanche breakdown 304 triggered parasitic bipolar junction transistor (BJT) Q1 may be utilized to quench the transient noise.

Figure 3A:
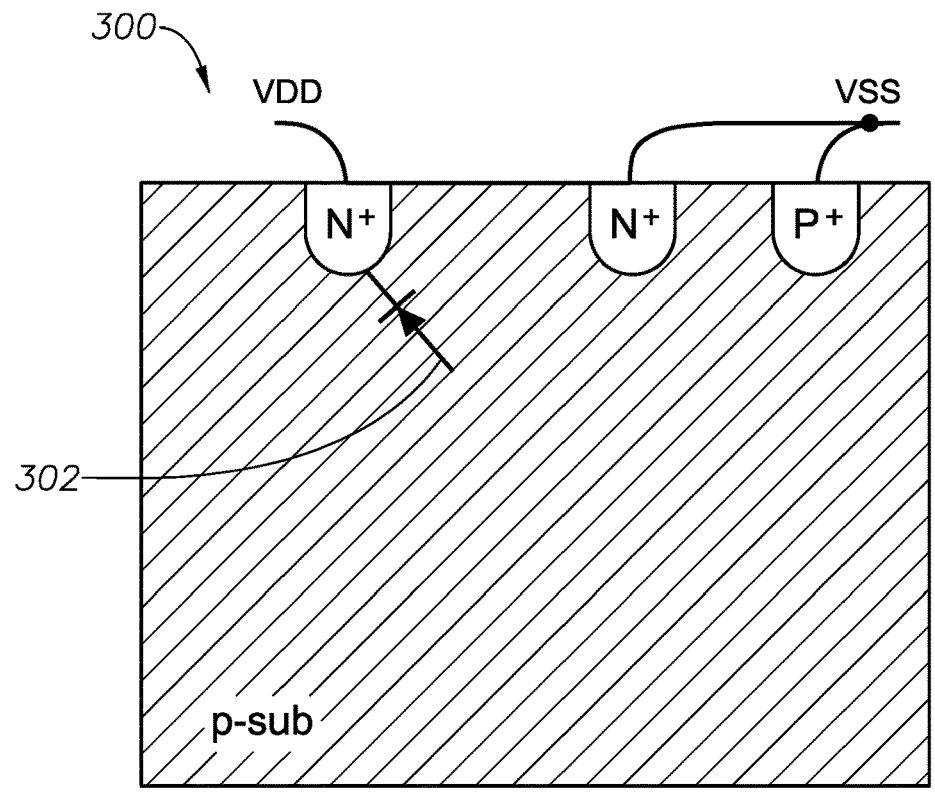
FIGS. 3A-3D are diagrams of a conventional clamping device and the example clamping device according to FIG. 1.
Figure 3B:
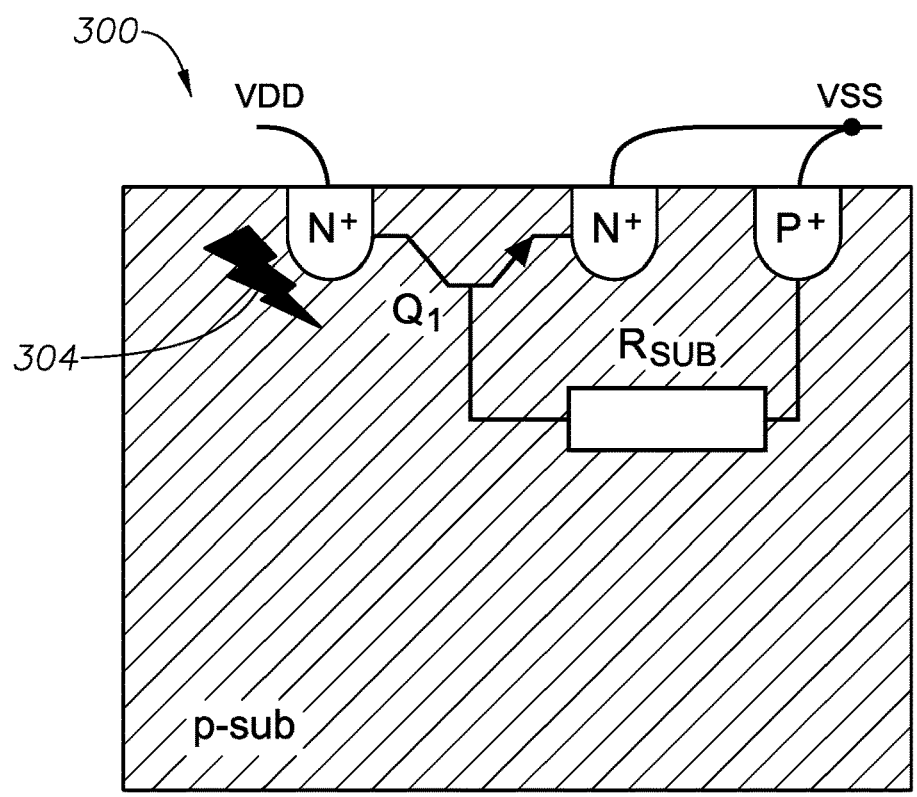
Figure 3C:
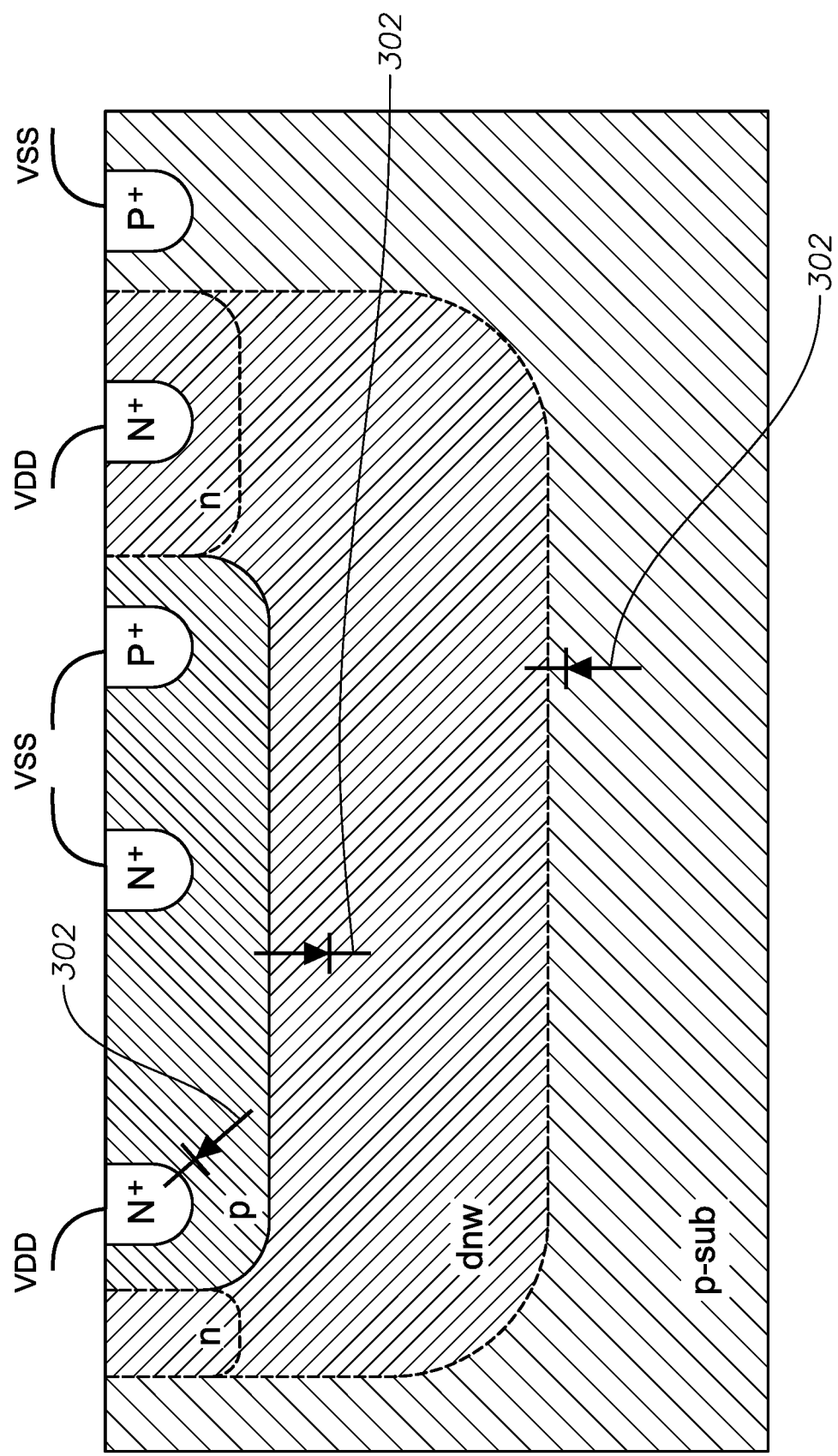
Figure 3D:
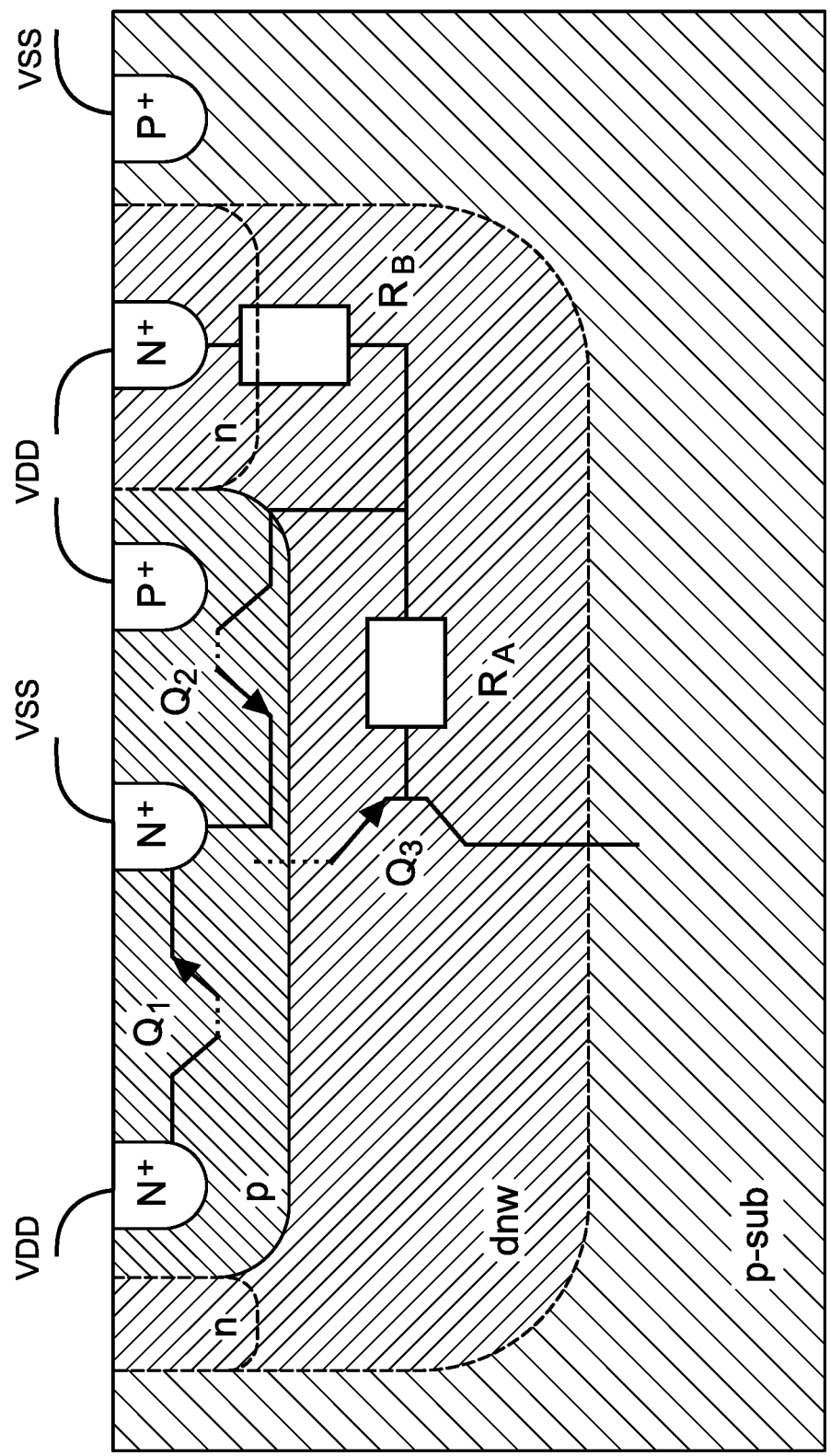

In contrast to the conventional scheme, in FIG. 3C, the clamping device 140 (and 440, 540, and 640 in alternative embodiments as described in below paragraphs) may include n-wells on opposing sides of a p-well and a deep n-well of n-doping that is implanted deeper into the p-substrate. The clamping device 140 may also have multiple parasitic diodes 302. In FIG. 3D, during an ESD event, responsive to the first and second drive signals 107, 117 (not shown), the clamping device 140 may involve a forced "turn-on" (activation) by full body-biasing of first and second parasitic bipolar junction transistors (BJTs), Q1 and Q2. When the bases of Q1 and Q2 are "turned-on", leakage current may be shorted to the ground (e.g., VSS, first voltage). Moreover, as no thyristor-like structures are exposed, latch-up risk is also minimized.

Figure 4:
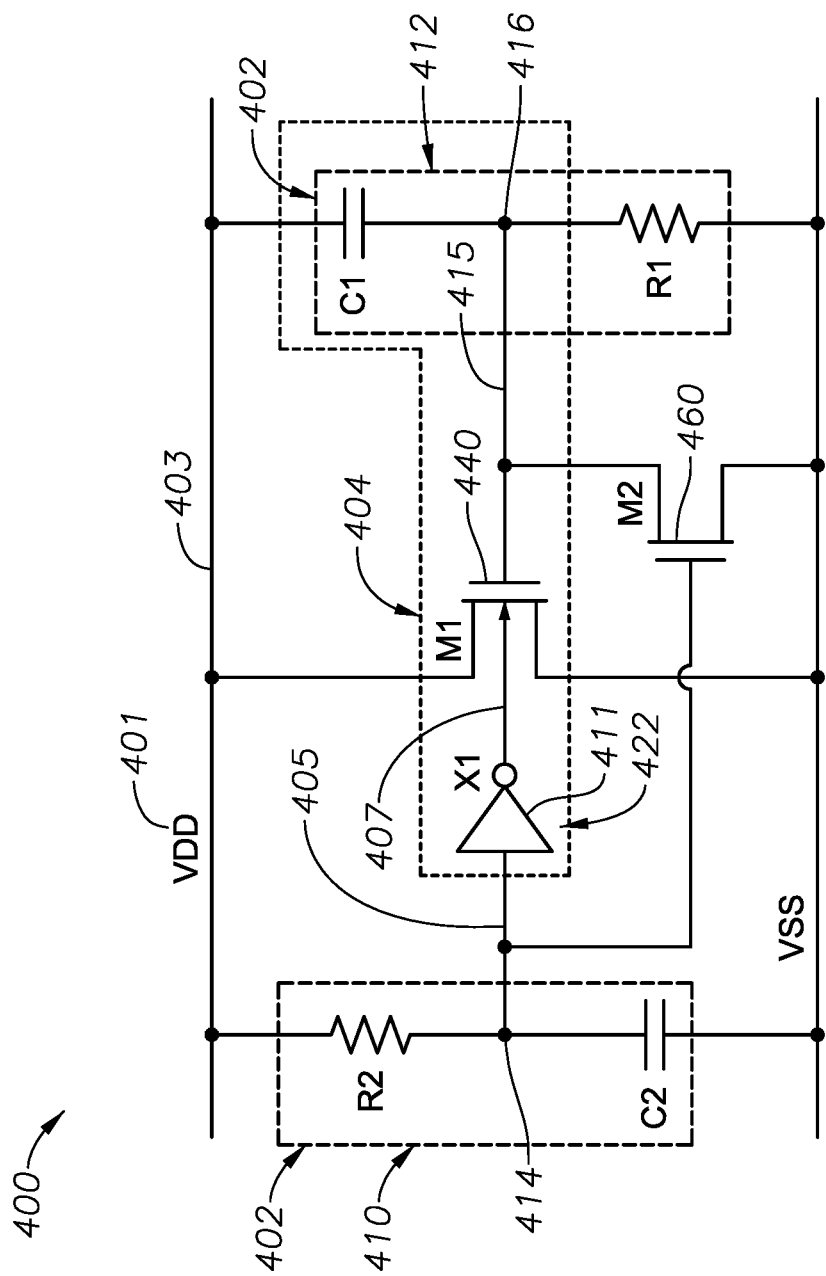
FIG. 4 is a circuit diagram of a system that is operable to control example clamping devices.

Referring to FIG. 4, a system 400 (i.e., an integrated circuit) to control clamping devices is shown. The system 400 includes a detection stage 402 (i.e., a detection circuit) and a control circuit 404. The detection stage 402 may be configured to quickly detect a destructive transient voltage signal 401 (e.g., a "noise" signal, a voltage transient, an external undesired electrical event) on a power supply rail 403 (i.e., power rail, supply rail, voltage source) (e.g., VDD) and provide detection signals 405 and 415 (i.e., transient-triggered detection signals or delayed versions of the transient voltage signal 401 to the control circuit 404. Enabled by the detection signals 405, 415, the control circuit 404 may be configured to control a body diode and a gate terminal of a first clamping device 440.

The detection stage 402 may include first and second detection portions 410, 412 responsive to the transient voltage signal 401 from the power supply rail 403. In an example implementation, the first detection portion 410 may be configured to provide the detection signal 405 as a delayed detection for the body diode of the first clamping device 440. The first detection portion 410 may include a first resistor R2 and a first capacitor C2 (i.e., a first R-C structure) that is coupled to a first reference node 414. The second detection portion 412 may be configured to provide the detection signal 415 as a "fast" detection for the gate terminal of the first clamping device 440. The second detection portion 412 may include a second resistor R1 and a second capacitor C1 (i.e., a second R-C structure) that is coupled to a second reference node 416. In operation, the second detection portion 412 may utilize the second capacitor C1, such that a rate at which the voltage of the power supply rail 403 changes over time ($\Delta v/\Delta t$, $dv/dt$) (e.g., a derivative) may "trigger" (i.e., engage) the gate terminal of the first clamping device 440 directly. Hence, in accordance with certain implementations, a gate drive signal (i.e., a gate driver, a second control signal) of the first clamping device 440 may no longer be required. As the gate drive signal is a source of current leakage, removal of the gate drive signal may provide additional current savings. In alternative implementations, the first and second detection portions 410, 412 may include other circuit elements and/or circuit devices that are configured to generate the detection signals 405, 415.

Responsive to the first and the second detection signals 405, 415, the control circuit 404 may be configured to enable (i.e., activate, "turn-on") the first clamping device 440 and a second clamping device 460 to quench transient voltage. The control circuit 404 may include an amplification portion 422, the first clamping device 440, and the second clamping device 460. In some implementations, the amplification portion 422 may include an inverter 411 that may be configured to generate a drive signal 407 (i.e., body driver) at the output of the amplification portion 422. The drive signal 407 may be configured to bias the body diode of the clamping device 440. For instance, as the drive signal 407 follows a low diode impedance path, "active" driving can be provided via the first detection portion 410 and the amplification portion 422. In alternative implementations, the control circuit 404 may include two or more amplification portions 422.

The first and second clamping devices 440, 460 may include any circuit device having at least two terminals. In some implementations, the first and second clamping devices 440, 460 may be one or more field-effect transistors (FET). For example, the first and second clamping device 440, 460 may be a n-channel FET or a big-FET. In example operations, the first and second clamping devices 440, 460 may be configured to shunt ESD current between supply rails, VDD and VSS, and to at least partially quench transient voltage (i.e., dissipate electrostatic charge) in the system 400.

In some implementations, the configuration/sizing of the second detection portion 412 including the second resistor R1 and the second capacitor C1 determines the circuit design trade-off. For example, if the second resistor R1 is small (such as a few M$\Omega$), then C1 would have to be comparatively large so as to charge the gate of the first clamping device 440 against the second resistor R1 (i.e., a "pull-down" resistor). Moreover, if the second resistor R1 is large (such as a few GS$\Omega$, as offered by "turned-off" MOS devices), the gate of the first clamping device 440 may "float" during normal operating voltage (i.e., steady-state operation) (such as approximately between 0.5V to approximately 1.7V). In other words, the gate may lack a sufficient "pull-down", thus allowing "weakly-coupled" noise signals to accidentally "turn-on" the first clamping device 440, and cause catastrophic damage during device operation. To avoid this scenario, the second clamping device 460 (i.e., a 'pull-down' device) may be included to allow for optimal sizing of the second capacitor C1 and the second resistor R1 so as to satisfy transient and steady-state operations respectively.

Advantageously, the system 400 may provide leakage savings when relatively fast voltage transients appear on a power rail. For example, on the nano-second order for Charged Device Model (CDM) type transients and micro-second order for Human Body Model (HBM) type transients. The system 400 provides ESD protection by coupling through the first and second detection portions 410, 412.

Figure 5:
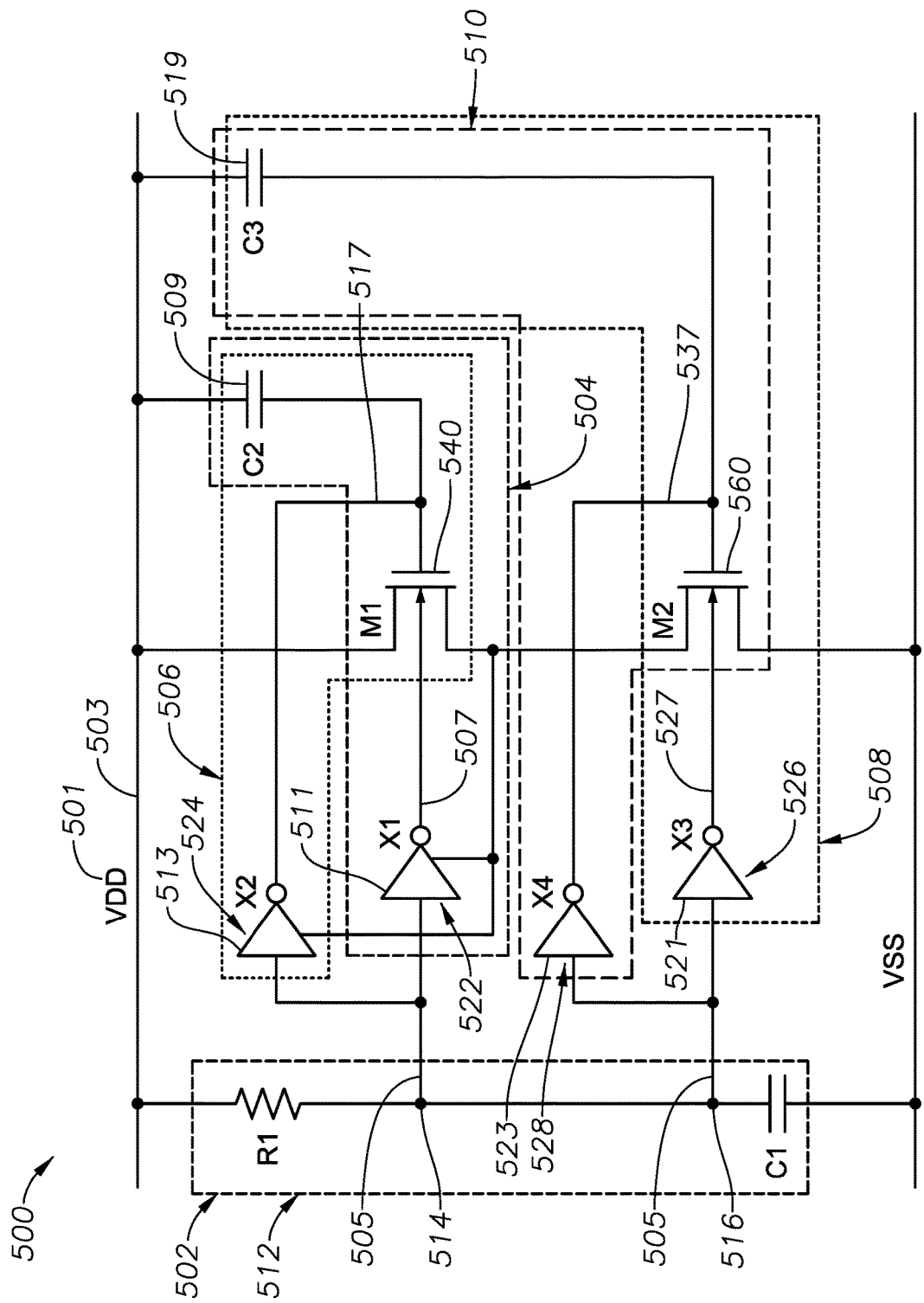
FIG. 5 is a circuit diagram of a system that is operable to control example clamping devices.

Referring to FIG. 5, a system 500 (i.e., an integrated circuit) that is operable to control clamping devices is shown. The system 500 includes a detection stage 502 (i.e., a detection circuit), a first control circuit 504, a second control circuit 506, a third control circuit 508, and a fourth control circuit 510. The detection stage 502 may be configured to quickly detect a destructive transient voltage signal (e.g., a "noise" signal, a voltage transient, an external undesired electrical event) on a power supply rail 503 (i.e., power rail, supply rail, voltage source) (e.g., VDD) and transmit a detection signal 505 (i.e., a transient-triggered detection signal, a delayed version of the transient voltage signal 501) to each of control circuits 504, 506, 508, 510. Enabled by the detection signal 505, the first control circuit 504 may be configured to control a body diode of a first clamping device 540, while the second control circuit 506 may be configured to control a gate terminal of the first clamping device 540. Also, enabled by the detection signal 505, the third control circuit 508 may be configured to control a body diode of a second clamping device 560, while the fourth control circuit 510 may be configured to control a gate terminal of the second clamping device 560.

The detection stage 502 may include a detection portion 512 having a resistor and a capacitor (i.e., an R-C structure) that is coupled to first and second reference nodes 514, 516, and that is responsive to the transient voltage signal 501 from the power supply rail 503. In alternative implementations, the detection portion 512 may include other circuit elements and/or devices that are configured to generate the detection signal 505.

Responsive to the detection signal 505, the first control circuit 504 and the second control circuit 506 are configured to activate the first clamping device 540 to quench transient rail voltage. The first control circuit 504 may include a first amplification portion 522, the first clamping device 540, and a first supporting capacitor 509. In some implementations, the first amplification portion 522 may include a first inverter 511 (e.g., a CMOS inverter or an NMOS inverter) that is configured to generate a first drive signal 507 at the output of the first amplification portion 522. The first drive signal 507 configured to bias the body diode of the first clamping device 540.

The second control circuit 506 may include a second amplification portion 524, the first clamping device 540, and the first supporting capacitor 509. In some implementations, the second amplification portion 524 may include a second inverter 513 that is configured to generate a second drive signal 517 at the output of the second amplification portion 524. The second drive signal 507 may be configured to bias the gate terminal of the first clamping device 540.

Responsive to the detection signal 505, the third control circuit 508 and the fourth control circuit 510 may be configured to activate the second clamping device 560 to quench transient rail voltage. The third control circuit 508 may include a third amplification portion 526, the second clamping device 560, and a second supporting capacitor 519. In some implementations, the third amplification portion 526 may include a third inverter 521 that is configured to generate a third drive signal 527 at the output of the third amplification portion 532. The third drive signal 527 may be configured to bias the body diode of the second clamping device 560.

The fourth control circuit 510 may include a fourth amplification portion 528, the second clamping device 560, and the second supporting capacitor 519. In some implementations, the fourth amplification portion 528 may include a fourth inverter 523 that is configured to generate a fourth drive signal 537 at the output of the fourth amplification portion 528. The fourth drive signal 537 may be configured to bias the gate terminal of the second clamping device 560.

The first and second clamping devices 540, 560 may include any circuit device having at least two terminals. In some implementations, the first and second clamping devices 540, 560 may be one or more field-effect transistors (FET). For example, the first and second clamping devices 540, 560 may be a n-channel FET or a big-FET. In operation, first and second clamping devices 540, 560 are configured to shunt ESD current between supply rails, VDD and VSS, and to at least partially quench transient voltage (i.e., dissipate electrostatic charge) in the system 500.

In particular implementations, a source terminal of the first clamping device 540 is coupled to a node coupling the drain terminal of the second clamping device 560 and a node coupling the first and second inverters 511, 513. Advantageously, as an example, the circuit coupling allows for the first clamping device 540 and first and second inverters 511, 513 to be configured to share a deep n-well (dnw).

The supporting capacitors 509, 519 may be configured to further reduce leakage from the second and fourth inverters 513, 523 of the second and fourth control circuits 506, 510, respectively. The supporting capacitors 509, 519 may be coupled between the power rail 503 and first and second nodes 516, 517 coupling the gate terminals of the first and second clamping devices 540, 560, respectively. Advantageously, the supporting capacitors 509, 519 may allow for improved ESD detection and clamp activation response time.

In some implementations, the system 100 (as shown in FIG. 1) and the system 400 (as shown in FIG. 4) may be suitable for normal operating voltage (such as approximately 0.5V to approximately 1.7V) when a gate-induced drain leakage (GIDL) of input/output (I/O) devices is a negligible percentage of total leakage. However, at high voltages (such as ≥1.8V), GIDL is a significant percentage of the total leakage. To address this particular problem, the system 500 (as shown in FIG. 5) may be utilized to reducing gate-to-drain voltage (VGD) of the first clamping device 540 to a mid-rail voltage, thereby reducing GIDL. In a particular implementation of the system 500, the first and second inverters 511, 513 share the same deep n-well (dnw) as the first clamping device 540. In doing so, the gate of the first clamping device 540, when turned-off, is connected to its source potential; hence the path followed is from the gate node to the source node, and any high voltage occurrence induced GIDL may be reduced. Also, the overall design 540 may be laid-out with a more smaller size, as the deep n-well is reused by the first and second inverters 511, 513 for generating the first and second drive signals 507, 517.

In an example operation of the system 500, under normal operating voltage, when both the first and second clamping devices 540, 560, are "turned-off", the first and second clamping devices 540, 560 resemble a voltage divider, as each of the first and second clamping devices receives approximately half the applied voltage. Of the two, the clamping device that receives the lower voltage amount, may provide the greater blocking protection against current leakage.

Figure 6:
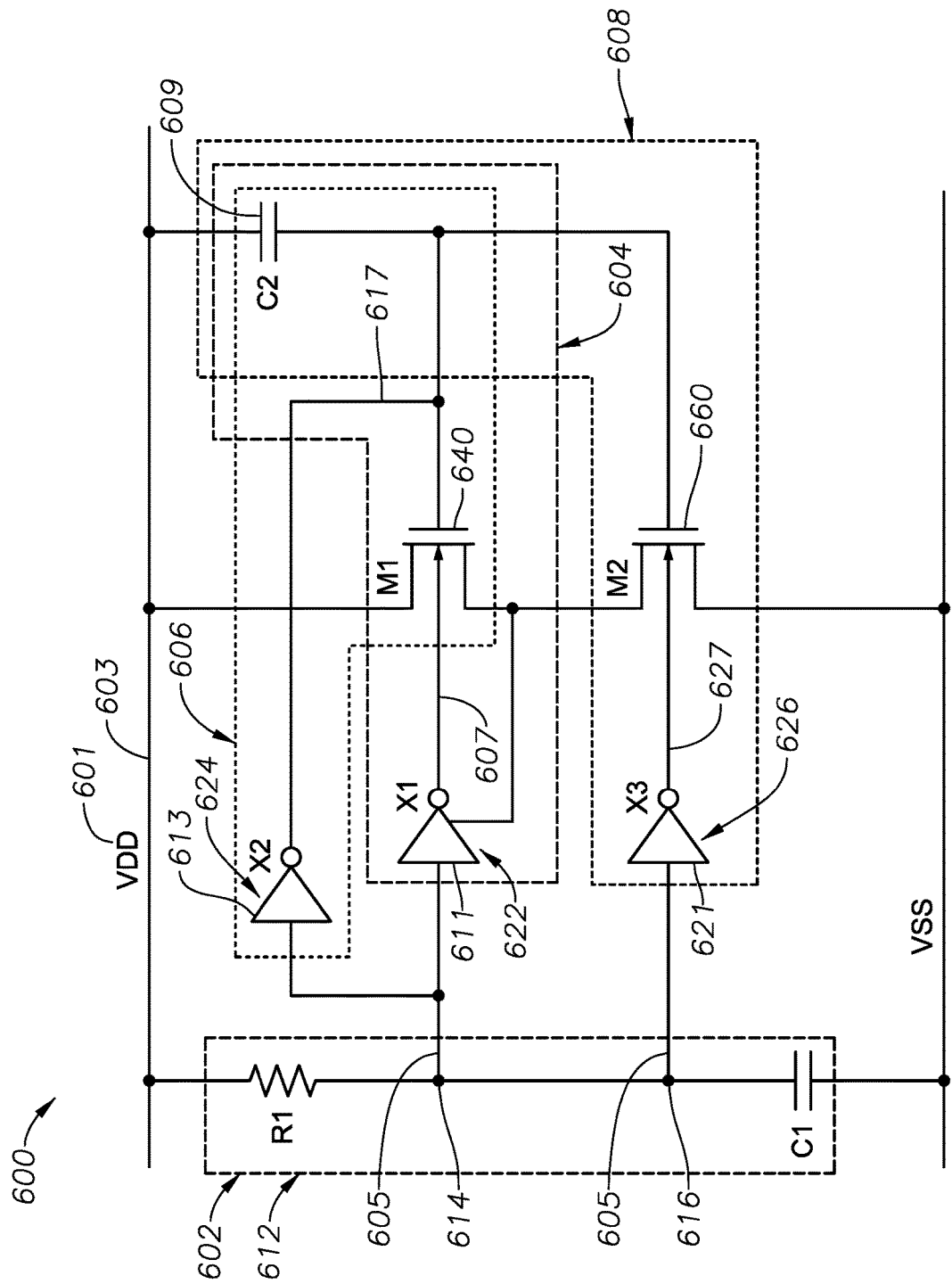
FIG. 6 is a circuit diagram of a system that is operable to control example clamping devices.

Referring to FIG. 6, a system 600 (i.e., an integrated circuit) that is operable to control clamping devices is shown. The system 600 includes a detection stage 602 (i.e., a detection circuit), a first control circuit 604, a second control circuit 606, and a third control circuit 608. The detection stage 602 may be configured to quickly detect a destructive transient voltage signal 601 (e.g., a "noise" signal, a voltage transient, an external undesired electrical event) on a power supply rail 603 (i.e., power rail, supply rail, voltage source) (e.g., VDD) and transmit a detection signal 605 (i.e., a transient-triggered detection signal or a delayed version of the transient voltage signal 601) to each of control circuits 604, 606, and 608. Enabled by the detection signal 605, the first control circuit 604 may be configured to control a body diode of a first clamping device 640, while the second control circuit 606 may be configured to control a gate terminal of the first clamping device 640. Also, enabled by the detection signal 605, the third control circuit 608 may be configured to control a body diode of a second clamping device 660.

The detection stage 602 may include a detection portion 612 having a resistor and a capacitor (i.e., an R-C structure) that is coupled to reference nodes 614, 616 and that is responsive to the transient voltage signal 601 from the power supply rail 603. In alternative implementations, the detection portion 612 may include other circuit elements and/or circuit devices that are configured to generate the detection signal 605.

Responsive to the detection signal 605, the first control circuit 604 and the second control circuit 606 are configured to enable the first clamping device 640 to quench transient rail voltage. The first control circuit 604 may include a first amplification portion 622, the first clamping device 640, and a first supporting capacitor 609. In some implementations, the first amplification portion 622 may include a first inverter 611 (e.g., a CMOS inverter or an NMOS inverter) that is configured to generate a first drive signal 607 at the output of the first amplification portion 622. The first drive signal 607 is configured to bias the body diode of the first clamping device 640.

The second control circuit 606 may include a second amplification portion 624, the first clamping device 640, and the first supporting capacitor 609. In some implementations, the second amplification portion 624 may include a second inverter 613 that is configured to generate a second drive signal 617 at the output of the second amplification portion 624. The second drive signal 607 is configured to bias the gate terminal of the first clamping device 640.

Responsive to the detection signal 605, the third control circuit 608 may be configured to enable the second clamping device 660 to quench transient rail voltage. The third control circuit 608 may include a third amplification portion 626, the second clamping device 660, and the first supporting capacitor 619. In some implementations, the third amplification portion 626 may include a third inverter 621 that is configured to generate a third drive signal 627 at the output of the third amplification portion 632. The third drive signal 627 may be configured to bias the body diode of the second clamping device 660.

The first and second clamping devices 640, 660 may include any circuit device having at least two terminals. In some implementations, the first and second clamping devices 640, 660 may be one or more field-effect transistors (FET). For example, the first and second clamping devices 640, 660 may be a n-channel FET or a big-FET. In operation, first and second clamping devices 640, 660 are configured to shunt ESD current between supply rails, VDD and VSS, and to at least partially quench transient voltage (i.e., dissipate electrostatic charge) suppress transient voltage in the system 600.

In particular implementations, a source terminal of the first clamping device 640 is coupled to a node coupling the drain terminal of the second clamping device 660 and a node coupling the first inverter 611. Advantageously, the circuit coupling allows for the first clamping device 640 and the first inverter 611 to be configured to share a deep N-well (dnw) of the first clamping device 640.

The supporting capacitor 609 may be configured to further reduce leakage from the second inverter 613 of the second control circuit 606. The supporting capacitor 609 may be coupled between the power rail 603 and first and second nodes coupling the gate terminals of the first and second clamping devices 640, 660, respectively. Advantageously, the supporting capacitor 609 may allow for improved ESD detection and clamp activation response time.

In some implementations, while the system 500 may be suitable for very high operating voltages where GIDL is prevalent, the system 600 (as shown in FIG. 6) may be suitable for operating voltage ranges where GIDL and the source-to-drain current leakages are comparable. Moreover, as compared to the systems 500 and 600, the system 100 may be suitable under normal operating voltages. As compared to the system 500 (as shown in FIG. 5), in the system 600, the second drive signal 617 originating from the second inverter 613 no longer shares a deep n-well with the first drive signal 607 and the first clamping device 640. As such, when the first clamping device 640 is "turned-off" (i.e., deactivated) during normal operation, a voltage of the gate of the first clamping device 640 may be configured to be "pulled" far below its source voltage. Hence, the gate terminal of the first clamping device 640 may be coupled, during normal operation, to a node at a potential lower than the drain terminal or the source terminal of the first clamping device 640. Accordingly, by removing the coupling between second inverter 613 and the source terminal of the first clamping device 640, not only may GIDL-based current leakage reduction and current leakage reduction due to the stacking of devices be achieved, but current leakage reduction as a result of reaching super cut-off limits may also be achieved through the first clamping device 640.

Figure 7:
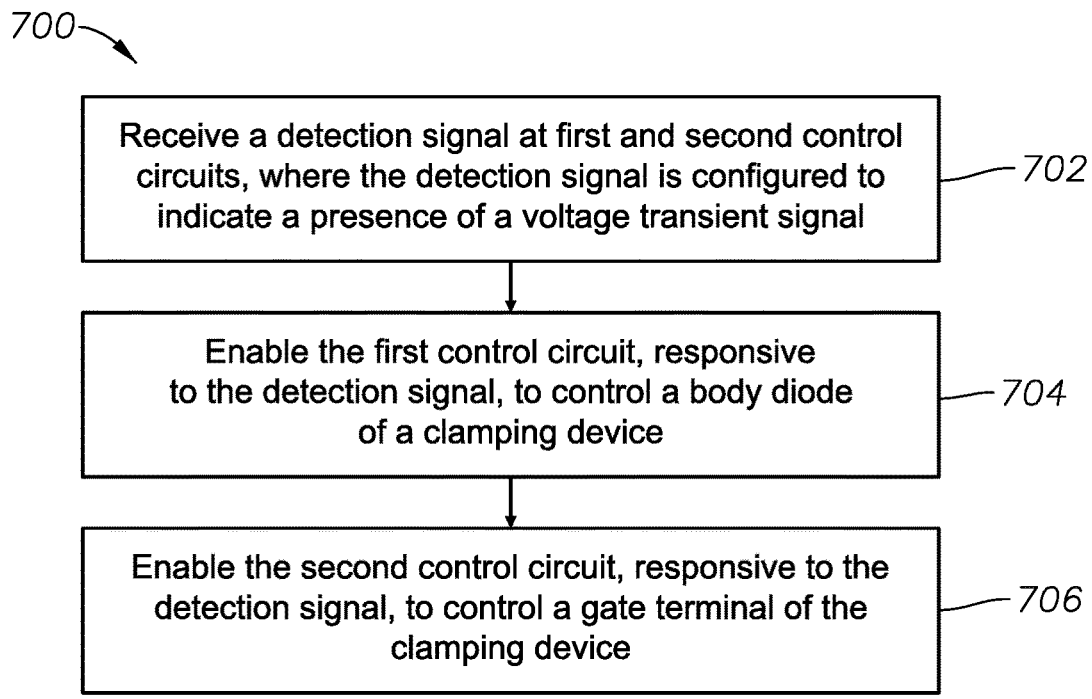
FIG. 7 is a method to control example clamping devices according to the systems of FIGS. 1, 5, and 6.

Referring to FIG. 7, a method to control clamping devices is shown. The method 700 may be performed by the system 100 of FIG. 1, the system 500 of FIG. 5, and the system 600 of FIG. 6.

The method 700 includes receiving a detection signal at first and second control circuits, at 702. The detection signal is configured to indicate a presence of a destructive transient voltage signal. For example, as described with reference to FIGS. 1, 5, and 6, the detection circuit (e.g., 102, 502, 602) may generate the detection signal (e.g., 105, 505, 605) if the transient voltage signal (e.g., 101, 501, 601) is detected on the power supply rail (e.g., 103, 503, 603), and transmit the detection signal (e.g., 105, 505, 605) to the first control circuit (e.g., 104, 504, 604) and the second control circuit (e.g., 106, 506, 606).

According to the method 700, the first control circuit that is responsive to the detection signal to control a body diode of a clamping device may be enabled, at 704. For example, referring to FIGS. 1, 5, and 6, responsive to the detection signal (e.g., 105, 505, 605), the first control circuit (e.g., 104, 504, 604) includes the amplification portion (e.g., 122, 522, 622) that generates a first drive signal (e.g., 107, 507, 607) that is configured to control the body diode of the clamping device (e.g., 140, 540, 640).

According to the method 700, the second control circuit that is responsive to the detection signal to control a gate terminal of the clamping device may be enabled, at 706. For example, referring to FIGS. 1, 5, and 6, responsive to the detection signal (e.g., 105, 505, 605), the second control circuit (e.g., 106, 506, 606) includes the second amplification portion (e.g., 124, 524, 624) that generates a second drive signal (e.g., 117, 517, 617) that is configured to control the body diode of the clamping device (e.g., 140, 540, 640).

Figure 8:
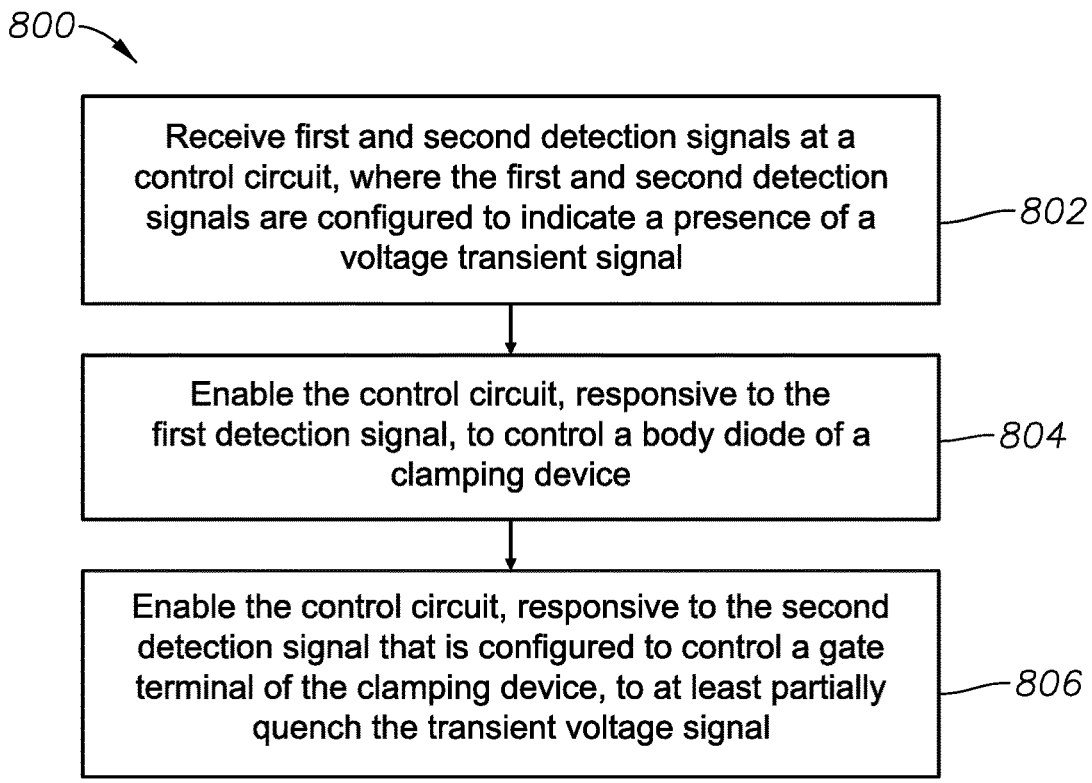
FIG. 8 is a method to control example clamping devices according to the system of FIG. 4.

Referring to FIG. 8, a method to control clamping devices is shown. The method 800 may be performed by the system 400 of FIG. 4.

The method 800 includes receiving first and second detection signals at a control circuit, at 702. The first and second detection signals are configured to indicate a presence of a destructive transient voltage signal. For example, as described with reference to FIG. 4, a detection circuit 402 may generate the first and second detection signals 405, 415 if a transient voltage signal 401 is detected on the power supply rail 403, and transmit the first and second detection signals 405, 415 to the control circuit 404.

According to the method 800, the control circuit that is responsive to the detection signal to control a body diode of a clamping device may be enabled, at 704. For example, referring to FIG. 4, responsive to the first detection signal 405, the control circuit 404 includes the amplification portion 422 that generates the second drive signal 407 that is configured to control the body diode of the clamping device 440.

According to the method 800, responsive to the second detection signal that is configured to control a gate terminal of the clamping device, the control circuit may be enabled to at least partially quench the transient voltage signal, at 706. For example, referring to FIG. 4, responsive to the second detection signal 415 that triggers a gate terminal of the clamping device 440, the control circuit 404 including the first clamping device 440 and the second clamping device 460 is activated to at least partially quench the transient voltage signal 401.

The systems 100, 400, 500, 600 may be used in any device. For example, a processing device may comprise an integrated circuit device or a protection circuit as described above. A processing device may be: a microcontroller unit (MCU) or a microprocessor, a central processing unit (CPU), a graphics processor, a coprocessor, a digital signal processor (DSP), an embedded processor, an application specific integrated circuit (ASIC), a field programmable gate array (FPGA), an analogue-to-digital converter, etc.

Although one or more of FIGS. 1-8 may illustrate systems, apparatuses, or methods according to the teachings of the disclosure, the disclosure is not limited to these illustrated systems, apparatuses, or methods. One or more functions or components of any of FIGS. 1-8 as illustrated or described herein may be combined with one or more other portions of another of FIGS. 1-8. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An integrated circuit comprising:
    a first control circuit, including a first amplification stage, responsive to a detection signal and configured to generate a first drive signal to control a body diode of a first clamping device; and
    a second control circuit, including a second amplification stage, responsive to the detection signal and configured to generate a second drive signal to control a gate terminal of the first clamping device,
    wherein the first clamping device and the first and second amplification stages are configured to share a deep-n-well.

2. The integrated circuit of claim 1, further comprising a detection circuit configured to detect a transient voltage and transmit the detection signal to the first and second control circuits.

3. The integrated circuit of claim 2, wherein the detection circuit comprises a detection portion having a resistor and a capacitor.

4. The integrated circuit of claim 1, wherein each of the first and second control circuits comprises one or more amplification stages, the first clamping device, and a supporting capacitor.

5. The integrated circuit of claim 1, wherein the first and second control circuits are configured to activate the first clamping device to at least partially quench a transient voltage.

6. The integrated circuit of claim 5, wherein the first clamping device activation comprises body-biasing of first and second parasitic bipolar junction transistors (BJTs) of the first clamping device.

7. The integrated circuit of claim 1, further comprising:
    a third control circuit responsive to the detection signal and configured to generate a third drive signal to control a body diode of a second clamping device, and
    a fourth control circuit responsive to the detection signal and configured to generate a fourth drive signal to control a gate terminal of the second clamping device.

8. The integrated circuit of claim 7, wherein: the first control circuit comprises a first amplification stage, the second control circuit comprises a second amplification stage, the third control circuit comprises a third amplification stage, and a fourth control circuit comprises a fourth amplification stage.

9. The integrated circuit of claim 8, wherein a source terminal of the first clamping device is coupled to a node coupling the drain terminal of the second clamping device and a node coupling the first and second amplification stages.

10. The integrated circuit of claim 7, further comprising:
    a third control circuit responsive to the detection signal and configured to generate a third drive signal to control a body diode of a second clamping device.

11. The integrated circuit of claim 10, wherein a source terminal of the first clamping device is coupled to a node coupling a drain terminal of the second clamping device and a node coupling the first amplification stage, and wherein a gate terminal of the first clamping device is coupled, during normal operation, to a node at a potential lower than the drain terminal or the source terminal of the first clamping device.

12. An integrated circuit comprising:
    a first control circuit responsive to a detection signal and configured to generate a first drive signal to control a body diode of a first clamping device; and a second control circuit responsive to the detection signal and configured to generate a second drive signal to control a gate terminal of the first clamping device a third control circuit responsive to the detection signal and configured to generate a third drive signal to control a body diode of a second clamping device, and a fourth control circuit responsive to the detection signal and configured to generate a fourth drive signal to control a gate terminal of the second clamping device, wherein the first control circuit comprises a first amplification stage, the second control circuit comprises a second amplification stage, the third control circuit comprises a third amplification stage, and a fourth control circuit comprises a fourth amplification stage, wherein the first clamping device and the first and second amplification stages are configured to share a deep-n-well.

13. A method comprising:

receiving a detection signal at first, second, third, and fourth control circuits, wherein the detection signal is configured to indicate a presence of a transient voltage signal;

enabling the first control circuit, responsive to the detection signal, to control a body diode of a first clamping device;

enabling the second control circuit, responsive to the detection signal, to control a gate terminal of the first clamping device;

enabling the third control circuit, responsive to the detection signal, to control a body diode of a second clamping device; and enabling the fourth control circuit, responsive to the detection signal, to control the gate terminal of the second clamping device, wherein a source terminal of the first clamping device and a drain terminal of the second clamping device is coupled to a node coupling the first and second control circuits.

14. The method of claim 13, wherein enabling the first control circuit comprises generating, by a first amplification portion, a first drive signal to bias the body diode of the first clamping device, and wherein enabling the second control circuit comprises generating, by a second amplification portion, a second drive signal to bias the gate terminal of the first clamping device.

15. The method of claim 13, wherein enabling the third control circuit comprises generating, by a third amplification portion, a third drive signal to bias the body diode of the second clamping device, and wherein enabling the second control circuit comprises generating, by the fourth amplification portion, a fourth drive signal to bias the gate terminal of the first clamping device.

16. The method of claim 13, further comprising:

receiving the detection signal at a third control circuit, wherein the detection signal is configured to indicate the presence of a transient voltage signal; and enabling the third control circuit, responsive to the detection signal, to control a body diode of a second clamping device.

17. The method of claim 13, wherein when the first clamping device is deactivated, pulling the gate of the first clamping device below a voltage of a source terminal of the first clamping device.

* * * * *